United States Patent
Li et al.

(10) Patent No.: US 11,250,922 B2
(45) Date of Patent: Feb. 15, 2022

(54) MEMORY CELL, MEMORY DEVICE, AND RELATED IDENTIFICATION TAG

(71) Applicant: AP Memory Technology Corp., Zhubei (TW)

(72) Inventors: Owen Yuwen Li, Zhubei (TW); Wen Liang Chen, Zhubei (TW)

(73) Assignee: AP Memory Technology Corp., Zhubei (TW)

( * ) Notice: Subject to any disclaimer, the term of this patent is extended or adjusted under 35 U.S.C. 154(b) by 0 days.

(21) Appl. No.: 16/852,878

(22) Filed: Apr. 20, 2020

(65) Prior Publication Data

US 2021/0327521 A1  Oct. 21, 2021

(51) Int. Cl.
| | | |
|---|---|---|
| G11C 17/16 | (2006.01) | |
| G11C 17/14 | (2006.01) | |
| G06K 19/07 | (2006.01) | |
| G11C 17/18 | (2006.01) | |

(52) U.S. Cl.
CPC ........ *G11C 17/143* (2013.01); *G06K 19/0723* (2013.01); *G11C 17/18* (2013.01)

(58) Field of Classification Search
CPC ...................................................... G11C 17/16
USPC ............................................................. 365/96
See application file for complete search history.

(56) References Cited

U.S. PATENT DOCUMENTS

| | | | |
|---|---|---|---|
| 7,715,246 B1* | 5/2010 | Kim ...................... | H01L 27/105 365/189.14 |
| 2008/0205150 A1 | 8/2008 | Pesavento | |
| 2009/0109723 A1* | 4/2009 | Buer ...................... | G11C 17/18 365/96 |
| 2017/0200508 A1* | 7/2017 | Grigoriev ............. | H04L 9/3228 |

* cited by examiner

*Primary Examiner* — Min Huang
(74) *Attorney, Agent, or Firm* — Chen Yoshimura LLP (57) ABSTRACT

A memory cell includes: a latch, powered by a first reference voltage and a second reference voltage different from the first reference voltage, and having a first connecting terminal and a second connecting terminal; a first programmable fuse, having a first terminal coupled to the first connecting terminal and a second terminal coupled to the second reference voltage; and a second programmable fuse, having a first terminal coupled to the second connecting terminal and a second terminal coupled to the second reference voltage.

19 Claims, 5 Drawing Sheets

| F1 | F2 | Data |
|---|---|---|
| programmed | non-programmed | 1 |
| non-programmed | programmed | 0 |

FIG. 10

MEMORY CELL, MEMORY DEVICE, AND RELATED IDENTIFICATION TAG

FIELD OF THE INVENTION

The present invention generally relates to a memory cell, a memory device and an identification tag. Specifically, the memory cell, memory device and identification tag are provided for receiving and/or transmitting identification data.

BACKGROUND OF THE INVENTION

Nowadays, radio-frequency identification (RFID) is used in many industries to automatically identify and track RFID tags attached to objects with electromagnetic fields performed with radio-frequency (RF) interface but without mechanical or optical contacts. If a RFID tag is programed to a predetermined frequency with a dedicated equipment, it will return a RF signal comprising the tag's protocol, managing organization, asset description and identification serial number after an electromagnetic interrogation pulse at the predetermined frequency generated by a RFID reader nearby is perceived. However, both energy consumption and transaction time may be great because much time and energy may be spent when a RFID tag accesses the data stored in its non-volatile memory, such as electrically-erasable programmable read-only memory (EEPROM) embedded therein. Further, in typical RFID tags, only 96 bits of non-volatile memory are used for storing the identification serial number, but comparatively larger area and power are consumed by peripheral read/write circuitry, such as charge pump. This limits the cost and sensitivity of the RFID tags.

Considering the data authenticity and data security, the current RFID tags may be flawed because some of them may be rewritten by reprogramming process performed by RFID transceivers coupled to a programmable logic controller (PLC) or computer. Data stored in the current RFID tags may be unreliable because the non-volatile memory may be vulnerable at high temperature or in radiation field.

SUMMARY OF THE INVENTION

One aspect of the present invention is to provide a memory cell, a memory device and an identification tag to receive and/or transmit identification data. According to one embodiment of the invention, a memory device for retaining identification data is provided with memory cells formed by at least programmable fuses electrically connecting with the dedicated latch to present an electrical characteristic depending on how the fuses get programmed. The size of the memory cell may be comparatively small and the time to sense the electrical characteristic may be less. Further, the data reliability in an extreme condition may be improved. Programming programmable fuses with laser or breaking in layout may be irreversibly written the identification data, preferably in a wafer level testing process in a semiconductor fabrication facility, and thus the data authenticity, data security, and writing throughput may be improved.

In one aspect of the invention, an embodiment of the invention is provided that a memory cell comprising a latch, a first programmable fuse and a second programmable fuse. The latch may be powered by a first reference voltage and a second reference voltage different from the first reference voltage, and have a first connecting terminal and a second connecting terminal. The first programmable fuse may have a first terminal coupled to the first connecting terminal and a second terminal coupled to the second reference voltage. The second programmable fuse may have a first terminal coupled to the second connecting terminal and a second terminal coupled to the second reference voltage.

In another aspect of the invention, an embodiment of the invention is provided that a memory cell comprising a latch, a first programmable fuse and a second programmable fuse. The latch may be powered by a first reference voltage and a second reference voltage different from the first reference voltage, and have a connecting terminal. The first programmable fuse may have a first terminal coupled to the connecting terminal and a second terminal coupled to the first reference voltage. The second programmable fuse may have a first terminal coupled to the connecting terminal and a second terminal coupled to the second reference voltage.

In another aspect of the invention, an embodiment of the invention is provided that an identification tag comprising a memory device for retaining identification data. The memory device for retaining identification data may comprise a memory block comprising a plurality of memory cells. At least one of the memory cells may comprise a latch, a first programmable fuse and a second programmable fuse. The latch may be powered by a first reference voltage and a second reference voltage different from the first reference voltage, and have a first connecting terminal and a second connecting terminal. The first programmable fuse may have a first terminal coupled to the first connecting terminal and a second terminal coupled to the second reference voltage. The second programmable fuse may have a first terminal coupled to the second connecting terminal and a second terminal coupled to the second reference voltage. One of the first programmable fuse and the second programmable fuse may be programmed to form an open circuit.

In another aspect of the invention, an embodiment of the invention is provided that a memory device for retaining identification data comprising a memory block and a sensing circuit. The memory block may comprise a plurality of memory cells each having a latch and a plurality of programmable fuses electrically connecting with the latch to present an electrical characteristic depending on how the programmable fuses get programmed. The sensing circuit electrically connecting with the memory block may sense the electrical characteristics of the memory cells. The electrical characteristics of the memory cells altogether may represent the identification data.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

In the present disclosure, examples of a memory cell, a memory device for retaining identification data and an identification tag are provided. Example embodiments of a memory cell may comprise a latch, a first programmable fuse and a second programmable fuse. The latch may be powered by a first reference voltage and a second reference voltage different from the first reference voltage, and have a first connecting terminal and a second connecting terminal. The first programmable fuse may have a first terminal coupled to the first connecting terminal and a second terminal coupled to the second reference voltage. The second programmable fuse may have a first terminal coupled to the second connecting terminal and a second terminal coupled to the second reference voltage.

Example embodiments of a memory cell may comprise a latch, a first programmable fuse and a second programmable fuse. The latch may be powered by a first reference voltage and a second reference voltage different from the first reference voltage, and have a connecting terminal. The first programmable fuse may have a first terminal coupled to the connecting terminal and a second terminal coupled to the first reference voltage. The second programmable fuse may have a first terminal coupled to the connecting terminal and a second terminal coupled to the second reference voltage.

Example embodiments of an identification tag may comprise a memory device for retaining identification data. The memory device for retaining identification data may comprise a memory block comprising a plurality of memory cells. At least one of the memory cells may comprise a latch, a first programmable fuse and a second programmable fuse. The latch may be powered by a first reference voltage and a second reference voltage different from the first reference voltage, and have a first connecting terminal and a second connecting terminal. The first programmable fuse may have a first terminal coupled to the first connecting terminal and a second terminal coupled to the second reference voltage. The second programmable fuse may have a first terminal coupled to the second connecting terminal and a second terminal coupled to the second reference voltage. One of the first programmable fuse and the second programmable fuse may be programmed to form an open circuit.

Example embodiments of a memory device for retaining identification data may comprise a memory block and a sensing circuit. The memory block may comprise a plurality of memory cells each having a latch and a plurality of programmable fuses electrically connecting with the latch to present an electrical characteristic depending on how the programmable fuses get programmed. The sensing circuit electrically connecting with the memory block may sense the electrical characteristics of the memory cells. The electrical characteristics of the memory cells altogether may represent the identification data.

Figure 1:
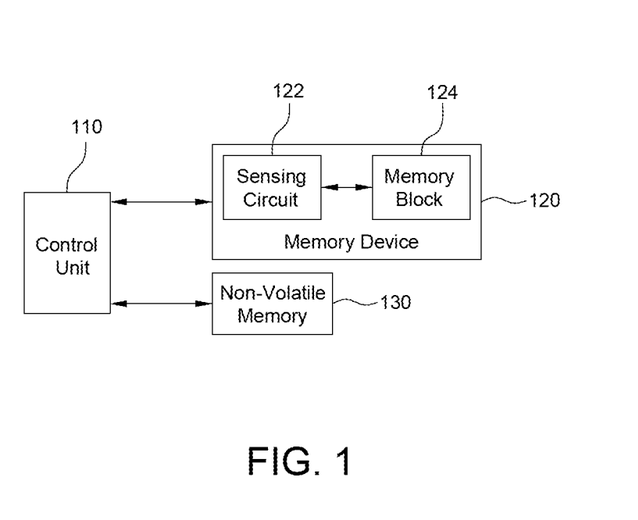
FIG. 1 illustrates an example block diagram of an identification tag according to a first example embodiment of the invention.
Figure 2:
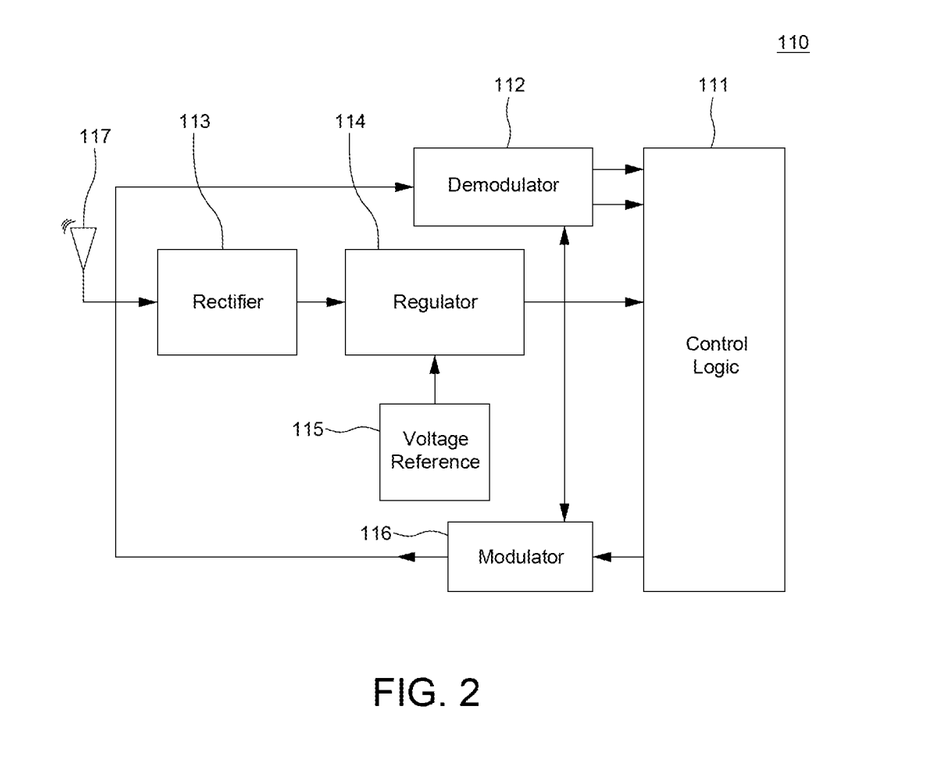
FIG. 2 illustrates an example block diagram of a protocol processing and control unit according to a first example embodiment of the invention.
Figure 3:
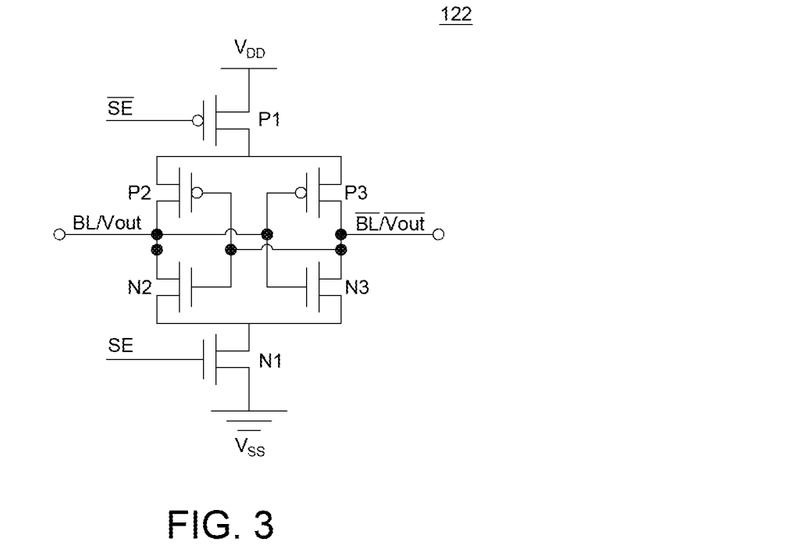
FIG. 3 illustrates an example circuit architecture of the sensing circuit of the identification tag according to the first example embodiment of the invention.
Figure 4:
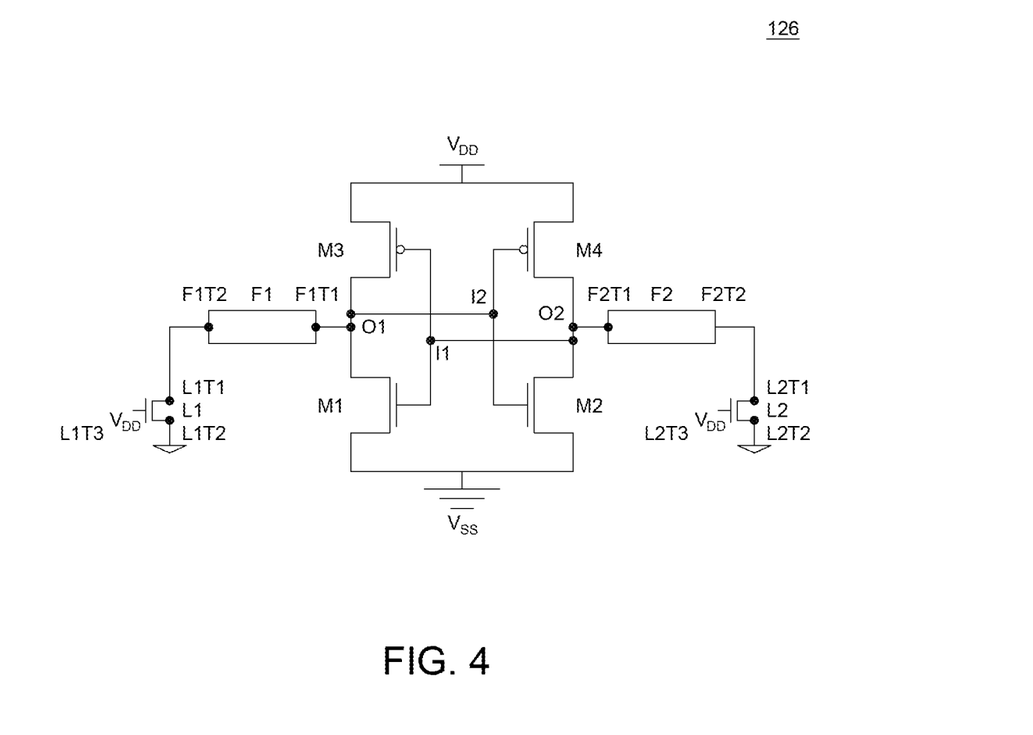
FIG. 4 illustrate five example circuit architectures of memory cell according to the first embodiment of the invention.
Figure 5:
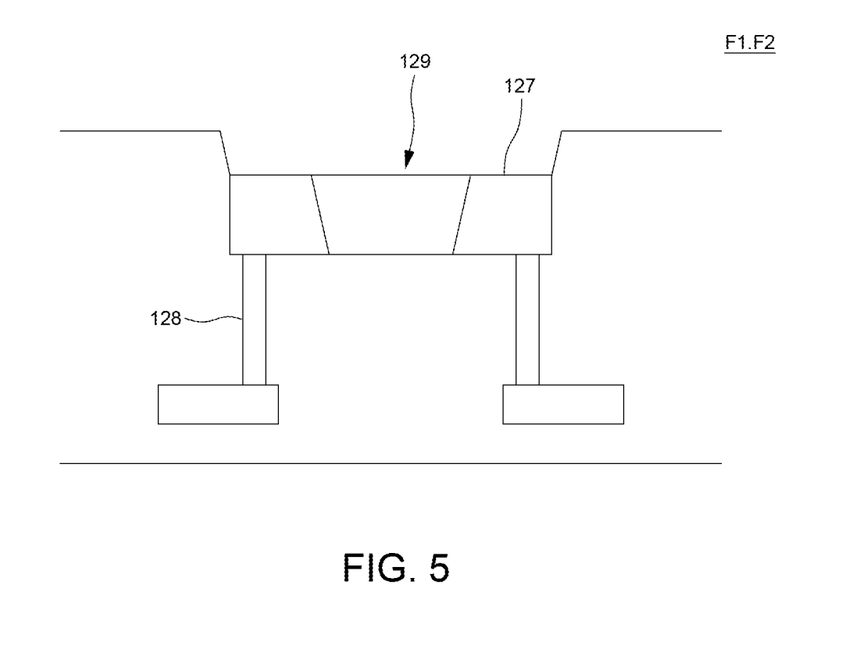
FIG. 5 illustrates an example circuit architecture of a programmable fuse according to the first embodiment of the invention.
Figure 10:
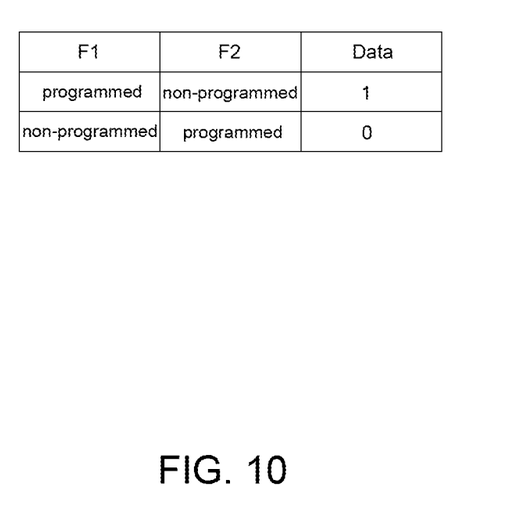
FIG. 10 depicts an example table illustrating the data represented by conditions of how the programmable fuses get blasted according to the first embodiment of the invention.

Reference is now made to FIGS. 1-5 and 10. FIG. 1 illustrates an example block diagram of an identification tag according to a first example embodiment of the invention. FIG. 2 illustrates an example block diagram of a protocol processing and control unit according to a first example embodiment of the invention. FIG. 3 illustrates an example circuit architecture of the sensing circuit of the identification tag according to the first example embodiment of the invention. FIG. 4 illustrates an example circuit architecture of memory cell according to the first embodiment of the invention. FIG. 5 illustrates an example circuit architecture of a programmable fuse according to the first embodiment of the invention. FIG. 10 depicts an example table illustrating the data represented by conditions of how the programmable fuses get programmed according to the first embodiment of the invention.

As shown in FIG. 1, an identification tag 100 of the present embodiment may comprise a protocol processing and control unit 110, a memory device 120 and a non-volatile memory 130. The protocol processing and control unit 110 electrically connecting with the memory device 120 and the non-volatile memory 130 may transmit a signal comprising identification data, stored in the memory device 120, to an identification reader (not shown) in complying with a communication standard. In the present embodiment, the communication standard may be implemented as but not limited to radio-frequency (RF) interface and in such a case, an identification reader may be a RFID reader and the identification tag 100 may be used to replace a RFID tag to implement radio-frequency identification. The signals transmitted may be radio frequency signals. When the protocol processing and control unit 110 completes a hand-shaking process using a predetermined frequency and packet protocol with the identification reader, it may output another signal comprising the identification data to the identification reader. As shown in FIG. 2, the example protocol processing and control unit 110 may comprise a control logic 111, a demodulator 112, a rectifier 113, a regulator 114, a voltage reference 115, a modulator 116 and an antenna 117. The control logic 111 may control the operation of the memory device 120 and the non-volatile memory 130. The modulator 116 may modulate signals before the antenna 117 emits them wirelessly. The signals receiving from the antenna 117 may be either demodulated by the demodulator 112 and then transmitted to the control logic 111, or rectified by the rectifier 113, chopped the DC voltage when exceeding a predetermined limiting value and regulated by the regulator 114 receiving at least one constant voltage from voltage reference 115 to generate at least one reference voltage, such as $V_{DD}$, which is then transmitted to the control logic 111.

The memory device 120 may comprise a sensing circuit 122 and a memory block 124. As shown in FIG. 3, the sensing circuit 122 electrically connecting with the memory block 124 may be implemented by but not limited to a sense amplifier constructed by three positive channel metal oxide semiconductors (PMOS) P1, P2, P3 and three negative channel metal oxide semiconductors (NMOS) N1, N2, N3. The sensing circuit 122 may be either multiplexed for sensing several bits or tied to a specific bit of the identification data retained in the memory block 124, but in the latter case, it may shorten sensing time.

The memory block 124 may comprise a plurality of memory cells each of which may have a latch and a plurality of programmable fuses electrically connecting with the latch. The number of the memory cells may be varied due to requirements, but in the context of radio-frequency identification (RFID) tag application in the present embodiment, it may be 96 bits to store a RFID serial number. An example memory cell 126 is shown in FIG. 4. The latch, powered by two reference voltages, $V_{DD}$ and $V_{SS}$, is constructed by two inverting gates electrically connected with each other reversely or cross-coupled with each other: one comprises a NMOS M1 and a PMOS M3 and the other one comprises a NMOS M2 and a PMOS M4. Here, $V_{DD}$ is a supply voltage, and $V_{SS}$ is a ground voltage. Preferably, $V_{DD}$ may be dynamic controlled to be turned on only during read-out from the memory cell 126. The inverting gate may be NOT gate, NAND gate, NOR gate, etc., and here, the both inverting gates are NOT gate for example. Two connecting terminals O1, O2 are offered. An output voltage level presented at a connecting terminal O1/O2 of the NOT gates may be inverted from the high level reference voltages, $V_{DD}$, at a connecting terminal I1/I2. For example, high voltage level inputted at the connecting terminal I1 may generate low voltage level outputted at the connecting terminal O1.

As shown in FIG. 5, the programmable fuses F1, F2 may be laser-programmable fuses, i.e. capable to be blasted or opened by laser to form an open circuit. Specifically, each programmable fuse F1, F2 may be constructed by a programmable portion 127 to be blasted by laser and two terminals of the programmable portion 127 may be formed with conductive vias 128 for connection. Preferably, a programming window (or an exposed opening) 129, in which the material constructing the programmable portion 127 is gone due to laser blasting, may be formed above the programmable portion 127. The laser beam may blast the programmable portion 127 through the programming window 129 to form an open circuit between two vias 128. As shown in FIG. 4, two programmable fuses F1, F2 grouping into a pair electrically connect with the connecting terminal I1/I2 of one of the inverting gates and the connecting terminal O2/O1 of the other one of the inverting gates respectively. The other terminal F1T2, F2T2 of the programmable fuses F1, F2 electrically connect with a limiting device L1/L2, such as a current limiting device which is implemented by a transistor, such as metal-oxide-semiconductor field-effect transistors (MOSFET), NMOS, etc., respectively. Specifically, the programmable fuse F1 may have a terminal F1T1 coupled to the connecting terminal O1 and another terminal F1T2 coupled to the reference voltage $V_{SS}$ through the limiting device L1, and the programmable fuse F2 may have a terminal F2T1 coupled to the connecting terminal O2 and another terminal F2T2 coupled to the reference voltage $V_{SS}$ through the limiting device L2. The limiting device L1/L2 may provide a connecting terminal L1T1/L2T1 coupled to the terminal F1T2/F2T2 of the programmable fuse F1/F2, another connecting terminal L1T2/L2T2 coupled to the reference voltage $V_{SS}$, and a control terminal L1T3/L2T3 coupled to a control signal $V_{DD}$, so that the limiting devices L1, L2 may be arranged to couple the terminals F1T2, F2T2 of the programmable fuses F1, F2 to the reference voltage $V_{SS}$ according to the control signal $V_{DD}$. The control signal $V_{DD}$ here is identical to the reference voltage $V_{DD}$ for example. Preferably, the programmable fuses F1, F2 may be implemented in a semiconductor chip with small sizes which are far smaller than the conventional non-volatile memory cells. The identification data may be written in the programmable fuses F1, F2 of each memory cell 126 by programming one of the programmable fuses F1, F2 with a laser. A condition of how the programmable fuses F1, F2 get programmed may affect an electrical characteristic presented at connecting terminal O2, sensed by the sensing circuit 122. In the present embodiment, the electrical characteristic may be voltage level. The writing process may be performed in a wafer level testing process in a semiconductor fabrication facility to improve writing throughput. The memory cells become read-only after written one-time by the laser. In other words, data authenticity and data security may be sound because the identification data may be fixed to what is written in the memory cells.

As shown in FIG. 10, bit values corresponding to a condition of how the programmable fuses get programmed are shown. When the programmable fuse F1 is programmed or blasted by laser beam and the programmable fuse F2 is not programmed, high voltage level is sensed at the connecting terminal O1 and a bit value of 1 is read from the memory cell 126. In contrast, when the programmable fuse F1 is not programmed and the programmable fuse F2 is programmed, low voltage level is sensed at the connecting terminal O1 and a bit value of 0 is read from the memory cell 126. Sensing the bit value only requires very low power-up energy but not special power-up sequence to simplify the circuit design of the sensing circuit 122 and expedite the sensing time. In addition, the limiting device L1 and/or L2 may be an optional device. In other embodiments, the terminal F1T2 and/or F2T2 may be directly connected to the reference voltage $V_{SS}$.

The non-volatile memory 130 may store configuration information, such as process related trimming settings related, for example, to transistor threshold/leakage or sheet resistance of resistors. In some embodiments of the invention, there may not exist a non-volatile memory in an identification tag.

Various example designs of a memory cell are shown in FIGS. 6-9. In each example memory cell, there are a latch, powered by two reference voltages, $V_{DD}$ and $V_{SS}$, and a plurality of programmable fuses electrically connecting with the latch. Preferably, two programmable fuses F1, F2 are grouped into a pair of programmable fuses. The programmable fuses may be implemented in a semiconductor chip with small sizes which are far smaller than the conventional non-volatile memory cells. The identification data may be written in the programmable fuses of each memory cell by programming one of the programmable fuses with a laser. A condition of how the programmable fuses get programmed may affect an electrical characteristic presented at a sensing point, sensed by the sensing circuit. In the present embodiment, the electrical characteristic may be voltage level. The writing process may be performed in a wafer level testing process in a semiconductor fabrication facility to improve writing throughput. The memory cells become read-only after written one-time by the laser. In other words, data authenticity and data security may be sound because the identification data may be fixed to what is written in the memory cells.

Figure 6:
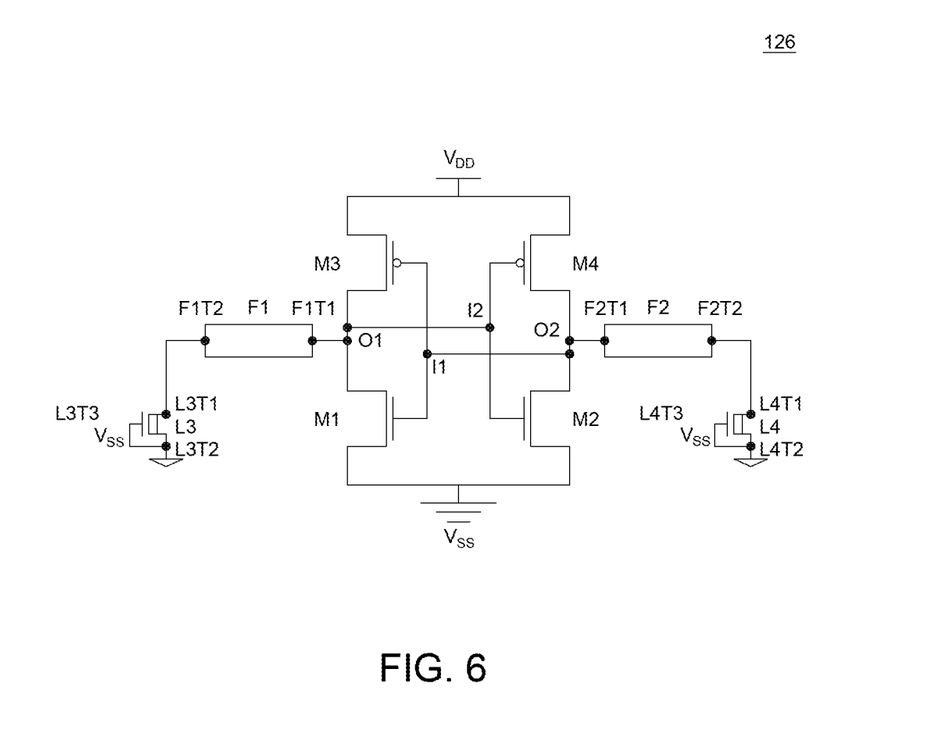
FIGS. 6 to 9 illustrate five example circuit architectures of memory cell according to the second, third, fourth and fifth embodiments of the invention.

In a second embodiment of the invention, a memory cell 126 may be designed as shown in FIG. 6. Similar to the one shown in FIG. 4, a latch is constructed by two inverting gates electrically connected with each other reversely: one comprises a NMOS M1 and a PMOS M3 and the other one comprises a NMOS M2 and a PMOS M4. An output voltage level presented at a connecting terminal O1/O2 of the NOT gates may be inverted from the high level reference voltages, $V_{DD}$, at a connecting terminal I1/I2. For example, high voltage level inputted at the connecting terminal I1 may generate low voltage level outputted at the connecting terminal O1. A terminal F1T1/F2T1 of programmable fuses F1, F2 electrically connects with the connecting terminal I1/I2 of one of the inverting gates and the connecting terminal O2/O1 of the other one of the inverting gates respectively. The other terminal F1T2/F2T2 of the programmable fuses F1, F2 is coupled to the reference voltage $V_{SS}$ through a limiting device L3/L4. The limiting devices L3, L4, such as a zero-$V_t$ device which is implemented by a transistor, such as native MOSFET here, may provide a connecting terminal L3T1/L4T1 coupled to the terminal F1T2/F2T2 of the programmable fuse F1/F2, another connecting terminal L3T2/L4T2 coupled to the reference voltage $V_{SS}$, and a control terminal L3T3/L4T3 coupled to a control signal $V_{SS}$, so that the limiting devices L3, L4 may be arranged to couple the terminals F1T2, F2T2 of the programmable fuses F1, F2 to the reference voltage $V_{SS}$ according to the control signal $V_{SS}$, which is identical to the reference voltage $V_{SS}$ for example.

In the present embodiment, when the programmable fuse F1 is programmed and the programmable fuse F2 is not programmed, high voltage level is sensed at the connecting terminal O1 and a bit value of 1 is read from the memory cell 126. In contrast, when the programmable fuse F1 is not programmed and the programmable fuse F2 is programmed, low voltage level is sensed at the connecting terminal O1 and a bit value of 0 is read from the memory cell 126. Sensing the bit value only requires very low power-up energy but not special power-up sequence to simplify the circuit design of the sensing circuit 122 and expedite the sensing time. In addition, the limiting device L3 and/or L4 may be an optional device. In other embodiments, the terminal F1T2 and/or F2T2 may be directly connected to the reference voltage $V_{SS}$.

Figure 7:
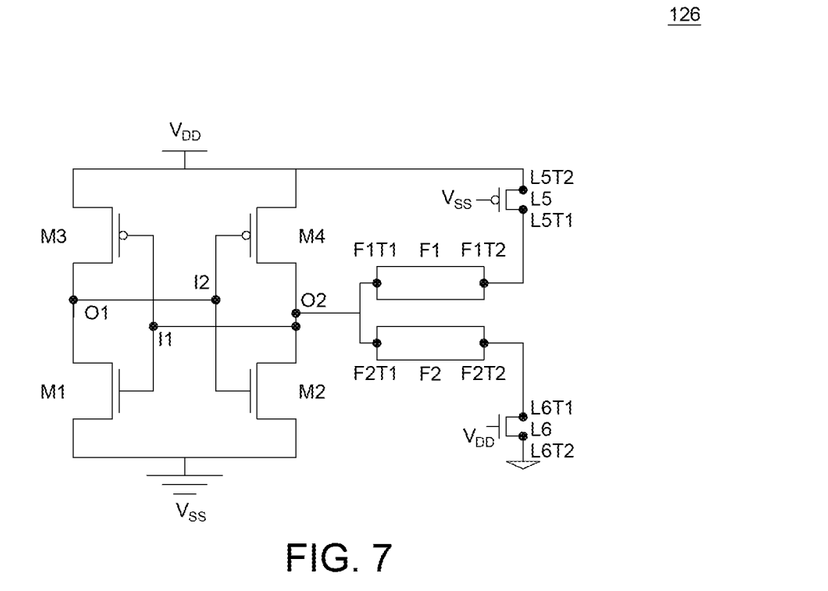

In a third embodiment of the invention, a memory cell 126 may be designed as shown in FIG. 7. Similar to the one shown in FIG. 4, a latch, powered by two reference voltages, $V_{DD}$ and $V_{SS}$, is constructed by two inverting gates electrically connected with each other reversely: one comprises a NMOS M1 and a PMOS M3 and the other one comprises a NMOS M2 and a PMOS M4. An output voltage level presented at a connecting terminal O1/O2 of the inverting gates may be inverted from the high level reference voltages, $V_{DD}$, at a connecting terminal I1/I2. For example, high voltage level inputted at the connecting terminal I1 may generate low voltage level outputted at the connecting terminal O1. Programmable fuses F1, F2 both electrically connect with the connecting terminal I1 of the inverting gate comprising the NMOS M1 and the PMOS M3 and the connecting terminal O2 of the other inverting gate comprising the NMOS M2 and the PMOS M4. The other terminal F1T2, F2T2 of the programmable fuses F1, F2 is coupled to the reference voltage $V_{DD}/V_{SS}$ through a limiting device L5, L6 respectively. The limiting devices L5, L6, such as current limiting device which is implemented by a transistor, such as NMOS and PMOS here, may provide a connecting terminal L5T1/L6T1 coupled to the terminal F1T2/F2T2 of the programmable fuse F1/F2, another connecting terminal L5T2/L6T2 coupled to the reference voltage $V_{DD}/V_{SS}$, and a control terminal L5T3/L6T3 coupled to a control signal $V_{SS}/V_{DD}$, so that the limiting devices L5, L6 may be arranged to couple the terminals F1T2, F2T2 of the programmable fuses F1, F2 to the reference voltage $V_{DD}/V_{SS}$ according to the control signal $V_{SS}/V_{DD}$, which is identical to the reference voltage $V_{SS}/V_{DD}$ for example.

In the present embodiment, when the programmable fuse F1 is programmed and the programmable fuse F2 is not programmed, high voltage level is sensed at the connecting terminal O1 and a bit value of 1 is read from the memory cell 126. In contrast, when the programmable fuse F1 is not programmed and the programmable fuse F2 is programmed, low voltage level is sensed at the connecting terminal O1 and a bit value of 0 is read from the memory cell 126. Sensing the bit value only requires very low power-up energy but not special power-up sequence to simplify the circuit design of the sensing circuit 122 and expedite the sensing time. In addition, the limiting device L3 and/or L4 may be an optional device. In other embodiments, the terminal F1T2 may be directly connected to the reference voltage $V_{DD}$ and/or the terminal F2T2 may be directly connected to the reference voltage $V_{SS}$.

Figure 8:
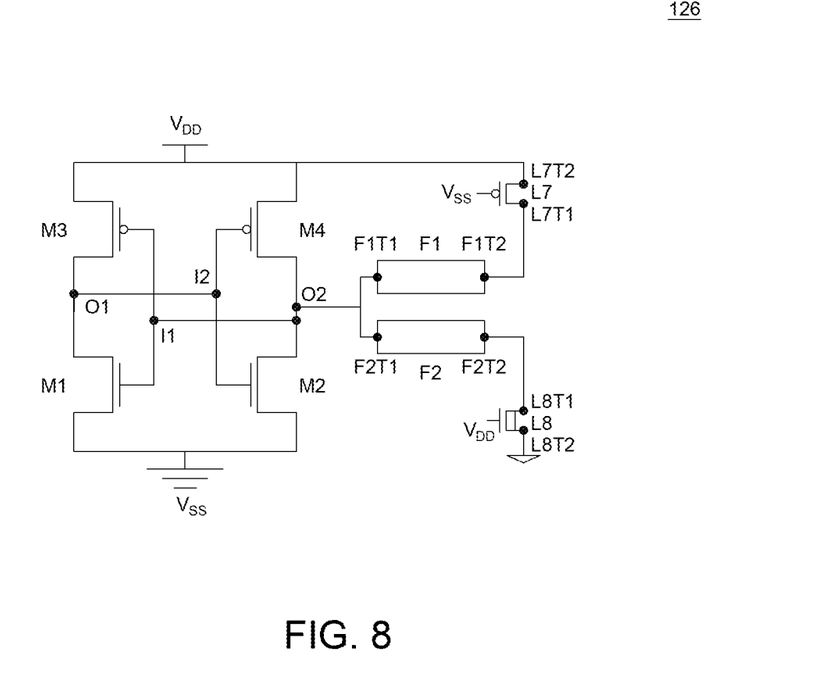

In a fourth embodiment of the invention, a memory cell 126 may be designed as shown in FIG. 8. Similar to the one shown in FIG. 4, a latch, powered by two reference voltages, $V_{DD}$ and $V_{SS}$, is constructed by two inverting gates electrically connected with each other reversely: one comprises a NMOS M1 and a PMOS M3 and the other one comprises a NMOS M2 and a PMOS M4. An output voltage level presented at a connecting terminal O1/O2 of the NOT gates may be inverted from the high level reference voltages, $V_{DD}$, at a connecting terminal I1/I2. For example, high voltage level inputted at the connecting terminal I1 may generate low voltage level outputted at the connecting terminal O1. Programmable fuses F1, F2 both electrically connect with the connecting terminal I1 of the inverting gate comprising the NMOS M1 and the PMOS M3 and the connecting terminal O2 of the other NOT gate comprising the NMOS M2 and the PMOS M4. The other terminal F1T2, F2T2 of the programmable fuses F1, F2 is coupled to the reference voltage $V_{DD}/V_{SS}$ through a limiting device L7, L8 respectively. The limiting devices L7, L8, such as current limiting device or zero-$V_t$ device which is implemented by a transistor, such as depletion mode NMOS and PMOS here, may provide a connecting terminal L7T1/L8T1 coupled to the terminal F1T2/F2T2 of the programmable fuse F1/F2, another connecting terminal L7T2/L8T2 coupled to the reference voltage $V_{DD}/V_{SS}$, and a control terminal L7T3/L8T3 coupled to a control signal $V_{SS}/V_{DD}$, so that the limiting devices L7, L8 may be arranged to couple the terminals F1T2, F2T2 of the programmable fuses F1, F2 to the reference voltage $V_{DD}/V_{SS}$ according to the control signal $V_{SS}/V_{DD}$, which is identical to the reference voltage $V_{SS}/V_{DD}$ for example.

In the present embodiment, when the programmable fuse F1 is programmed and the programmable fuse F2 is not programmed, high voltage level is sensed at the connecting terminal O1 and a bit value of 1 is read from the memory cell 126. In contrast, when the programmable fuse F1 is not programmed and the programmable fuse F2 is programmed, low voltage level is sensed at the connecting terminal O1 and a bit value of 0 is read from the memory cell 126. Sensing the bit value only requires very low power-up energy but not special power-up sequence to simplify the circuit design of the sensing circuit 122 and expedite the sensing time. In addition, the limiting device L7 and/or L8 may be an optional device. In other embodiments, the terminal F1T2 may be directly connected to the reference voltage $V_{DD}$ and/or the terminal F2T2 may be directly connected to the reference voltage $V_{SS}$.

Figure 9:
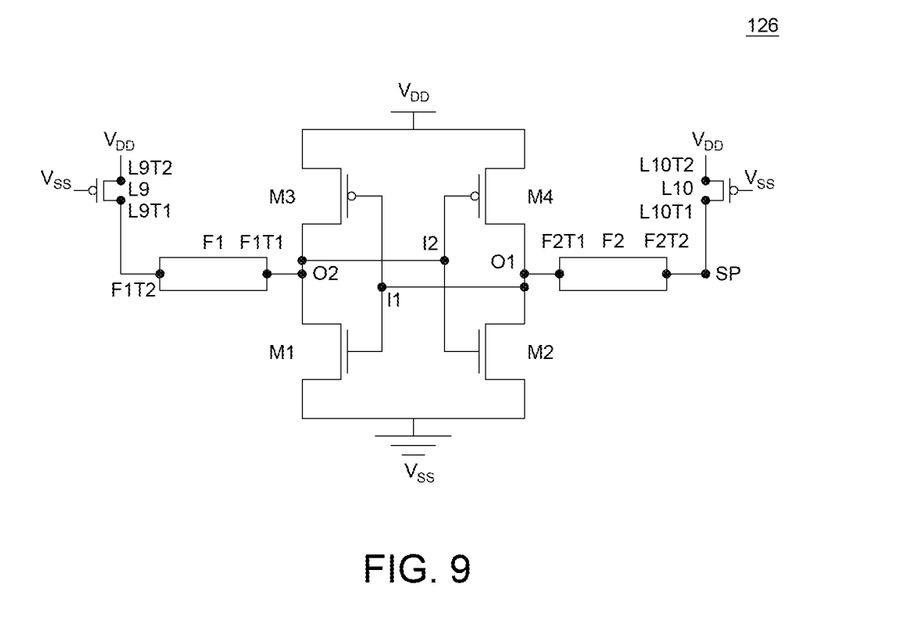

In a fifth embodiment of the invention, a memory cell 126 may be designed as shown in FIG. 9. Similar to the one shown in FIG. 4, a latch, powered by two reference voltages, $V_{DD}$ and $V_{SS}$, is constructed by two inverting gates electrically connected with each other reversely: one comprises a NMOS M1 and a PMOS M3 and the other one comprises a NMOS M2 and a PMOS M4. An output voltage level presented at a connecting terminal O1/O2 of the inverting gates may be inverted from high level reference voltages, $V_{DD}$, at a connecting terminal I1/I2. For example, high voltage level inputted at the connecting terminal I1 may generate low voltage level outputted at the connecting terminal O1. Programmable fuses F1, F2 electrically connect with the connecting terminal I1/I2 of one of the inverting gates and the connecting terminal O2/O1 of the other one of the inverting gates respectively. The other terminal F1T2, F2T2 of the programmable fuses F1, F2 is coupled to the reference voltage $V_{DD}$ through a limiting devices L9, L10 respectively. The limiting devices L9, L10, such as current limiting device which is implemented by a transistor, such as PMOS here, may provide a connecting terminal L9T1/L10T1 coupled to the terminal F1T2/F2T2 of the programmable fuse F1/F2, another connecting terminal L9T2/L10T2 coupled to the reference voltage $V_{DD}$, and a control terminal L9T3/L10T3 coupled to a control signal $V_{SS}$, so that the limiting devices L9, L10 may be arranged to couple the terminals F1T2, F2T2 of the programmable fuses F1, F2 to the reference voltage $V_{DD}$ according to the control signal $V_{SS}$, which is identical to the reference voltage $V_{SS}$ for example.

In the present embodiment, when the programmable fuse F1 is programmed and the programmable fuse F2 is not programmed, high voltage level is sensed at the connecting terminal O2 and a bit value of 1 is read from the memory cell 126. In contrast, when the programmable fuse F1 is not programmed and the programmable fuse F2 is programmed, low voltage level is sensed at the connecting terminal O2 and a bit value of 0 is read from the memory cell 126. Sensing the bit value only requires very low power-up energy but not special power-up sequence to simplify the circuit design of the sensing circuit 122 and expedite the sensing time. In addition, the limiting device L9 and/or L10 may be an optional device. In other embodiments, the terminal F1T2 and/or F2T2 may be directly connected to the reference voltage $V_{DD}$.

In a sixth embodiment of the invention, a memory cell 126 may be designed as shown in one of FIGS. 4 and 6-10. In a memory cell 126, one of the programmable fuses F1, F2 may be pre-programmed by breaking in layout, i.e. one of the programmable fuses F1, F2 may be made to be broken. Preferably, in some dice on reticle may be pre-programmed to reduce programming time, but some other dice on reticle may not be pre-programmed. Specifically, the dice which may be pre-programmed may be pre-programmed with incrementing serial number by 1. Then, only bits common to most dice on the reticle need to be programmed by laser.

According to the present invention, the threshold voltages of the transistors in the limiting devices L1-L10 are not limited to those as shown in FIG. 4 and FIGS. 6-9 respectively, the threshold voltages of those transistors may be arranged to have a plurality of customized threshold voltages to optimize the performances of the memory cells respectively.

According to the above, a memory device, an identification tag and an identification data reception and transmission system to receive and/or transmit identification data in embodiments of the invention store identification data in well-designed and novel memory cells each of which is formed by at least programmable fuses electrically connecting with a latch to present an electrical characteristic corresponding to a condition of how the programmable fuses get programmed. The size of the memory cell may be comparatively smaller and the time to sense the electrical characteristic may be less. Further, the data reliability in an extreme condition may be improved. Programming programmable fuses with laser may irreversibly written the identification data, preferably in a wafer level testing process in a semiconductor fabrication facility, and thus the data authenticity, data security, and writing throughput may be improved.

While various embodiments in accordance with the disclosed principles are described above, it should be understood that they are presented by way of example only, and are not limiting. Thus, the breadth and scope of example embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages including without limitation processes providing special transistors with customized threshold voltages. Further, all of the numerical ranges including the maximum and minimum values and the values therebetween which are obtained from the combining proportion relation of the optical parameters disclosed in each embodiment of the present disclosure are implementable.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A memory cell, comprising:
   a latch, powered by a first reference voltage and a second reference voltage different from the first reference voltage, and having a first connecting terminal and a second connecting terminal;

a first programmable fuse, having a first terminal coupled to the first connecting terminal and a second terminal coupled to the second reference voltage;
a second programmable fuse, having a first terminal coupled to the second connecting terminal and a second terminal coupled to the second reference voltage;
a first limiting circuit, arranged to couple the second terminal of the first programmable fuse to the second reference voltage according to a first control signal, wherein the first limiting circuit comprises:
a first transistor, having a first connecting terminal coupled to the second terminal of the first programmable fuse, a second connecting terminal coupled to the second reference voltage, and a control terminal coupled to the first control signal; and
a second limiting circuit, arranged to couple the second terminal of the second programmable fuse to the second reference voltage according to a second control signal, wherein the second limiting circuit comprises:
a second transistor, having a first connecting terminal coupled to the second terminal of the first programmable fuse, a second connecting terminal coupled to the second reference voltage, and a control terminal coupled to the second control signal;
wherein the first transistor and the second transistor are metal-oxide-semiconductor field-effect transistors (MOSFET), and the first control signal and the second control signal are the first reference voltage.

2. The memory cell according to claim 1, wherein one of the first reference voltage and the second reference voltage is a supply voltage and the other of the first reference voltage and the second reference voltage is a ground voltage.

3. The memory cell according to claim 1, wherein the first programmable fuse and the second programmable fuse are laser-programmable fuses.

4. The memory cell according to claim 1, wherein one of the first programmable fuse and the second programmable fuse is pre-programmed.

5. A memory cell, comprising:
a latch, powered by a first reference voltage and a second reference voltage different from the first reference voltage, and having a first connecting terminal and a second connecting terminal;
a first programmable fuse, having a first terminal coupled to the first connecting terminal and a second terminal coupled to the second reference voltage;
a second programmable fuse, having a first terminal coupled to the second connecting terminal and a second terminal coupled to the second reference voltage;
a first limiting circuit, arranged to couple the second terminal of the first programmable fuse to the second reference voltage according to a first control signal, wherein the first limiting circuit comprises:
a first transistor, having a first connecting terminal coupled to the second terminal of the first programmable fuse, a second connecting terminal coupled to the second reference voltage, and a control terminal coupled to the first control signal; and
a second limiting circuit, arranged to couple the second terminal of the second programmable fuse to the second reference voltage according to a second control signal, wherein the second limiting circuit comprises:
a second transistor, having a first connecting terminal coupled to the second terminal of the first programmable fuse, a second connecting terminal coupled to the second reference voltage, and a control terminal coupled to the second control signal;
wherein the first transistor and the second transistor are native MOSFETs, and the first control signal and the second control signal are the second reference voltage.

6. The memory cell according to claim 1, wherein one of the first programmable fuse and the second programmable fuse is programmed to form an open circuit.

7. The memory cell according to claim 1, wherein one of the first control signal and the second control signal is a supply voltage, which is turned on only during read-out from the memory cell.

8. A memory cell, comprising:
a latch, powered by a first reference voltage and a second reference voltage different from the first reference voltage, and having a connecting terminal;
a first programmable fuse, having a first terminal coupled to the connecting terminal and a second terminal coupled to the first reference voltage;
a second programmable fuse, having a first terminal coupled to the connecting terminal and a second terminal coupled to the second reference voltage;
a first limiting circuit, arranged to couple the second terminal of the first programmable fuse to the first reference voltage according to a first control signal; and
a second limiting circuit, arranged to couple the second terminal of the second programmable fuse to second reference voltage according to a second control signal;
wherein the first control signal is the second reference voltage and the second control signal is the first reference voltage.

9. The memory cell according to claim 8, wherein one of the first reference voltage and the second reference voltage is a supply voltage and the other of the first reference voltage and the second reference voltage is a ground voltage.

10. The memory cell according to claim 8, wherein one of the first programmable fuse and the second programmable fuse is pre-programmed.

11. The memory cell according to claim 8, wherein the first programmable fuse and the second programmable fuse are laser-programmable fuses.

12. The memory cell according to claim 8, wherein the first limiting circuit comprises:
a first transistor, having a first connecting terminal coupled to the second terminal of the first programmable fuse, a second connecting terminal coupled to the first reference voltage, and a control terminal coupled to the first control signal; and
the second limiting circuit comprises:
a second transistor, having a first connecting terminal coupled to the second terminal of the first programmable fuse, a second connecting terminal coupled to the second reference voltage, and a control terminal coupled to the second control signal;
wherein the first control signal is the second reference voltage and the second control signal is the first reference voltage.

13. The memory cell according to claim 12, wherein the first transistor is a p-type MOSFET, and the second transistor is an n-type MOSFET.

14. The memory cell according to claim 8, wherein one of the first programmable fuse and the second programmable fuse is programmed to form an open circuit.

15. The memory cell according to claim 8, wherein one of the first control signal and the second control signal is a supply voltage, which is turned on only during read-out from the memory cell.

16. An identification tag, comprising:
a memory device for retaining identification data, comprising:
- a memory block, comprising a plurality of memory cells, and at least one of the plurality of memory cells comprising:
  - a latch, powered by a first reference voltage and a second reference voltage different from the first reference voltage, and having a first connecting terminal and a second connecting terminal;
  - a first programmable fuse, having a first terminal coupled to the first connecting terminal and a second terminal coupled to the second reference voltage;
  - a second programmable fuse, having a first terminal coupled to the second connecting terminal and a second terminal coupled to the second reference voltage;
  - a first limiting circuit, arranged to couple the second terminal of the first programmable fuse to the first reference voltage according to a first control signal, wherein the first limiting circuit comprises:
    - a first transistor, having a first connecting terminal coupled to the second terminal of the first programmable fuse, a second connecting terminal coupled to the second reference voltage, and a control terminal coupled to the first control signal; and
  - a second limiting circuit, arranged to couple the second terminal of the second programmable fuse to second reference voltage according to a second control signal, wherein the second limiting circuit comprises:
    - a second transistor, having a first connecting terminal coupled to the second terminal of the first programmable fuse, a second connecting terminal coupled to the second reference voltage, and a control terminal coupled to the second control signal;
  - wherein one of the first programmable fuse and the second programmable fuse is programmed to form an open circuit, the first transistor and the second transistor are metal-oxide-semiconductor field-effect transistors (MOSFET), and the first control signal and the second control signal are the first reference voltage.

17. The memory device according to claim 16, wherein one of the first reference voltage and the second reference voltage is a supply voltage and the other of the first reference voltage and the second reference voltage is a ground voltage.

18. The memory device according to claim 16, wherein the first programmable fuse and the second programmable fuse are laser-programmable fuses.

19. The memory device according to claim 16, wherein, for at least one memory cell, the latch comprises two inverting gates having the first connecting terminal and the second connecting terminal.

* * * * *